United States Patent [19]

Hoke et al.

[11] Patent Number: 4,886,683

[45] Date of Patent: Dec. 12, 1989

[54] LOW TEMPERATURE METALORGANIC CHEMICAL VAPOR DEPOSTION GROWTH OF GROUP II-VI SEMICONDUCTOR MATERIALS

[75] Inventors: William E. Hoke, Wayland; Lindley T. Specht, Waltham; Ralph Korenstein, Framingham, all of Mass.

[73] Assignee: Raytheon Company, Lexington, Mass.

[21] Appl. No.: 876,608

[22] Filed: Jun. 20, 1986

[51] Int. Cl.$^4$ ............................................. C22C 16/00
[52] U.S. Cl. .................................... 427/252; 427/255; 427/255.2; 437/2.15
[58] Field of Search ............. 427/91, 252, 255, 255.2; 148/175; 437/245

[56] References Cited

U.S. PATENT DOCUMENTS

| | | | |
|---|---|---|---|
| 3,083,550 | 4/1963 | Averbach | 427/252 |
| 3,218,203 | 0/0000 | Ruehrwein | 148/175 |
| 3,305,386 | 2/1967 | Hafner et al. | 427/252 |
| 3,619,282 | 0/0000 | Manley et al. | 427/252 |
| 4,321,073 | 3/1982 | Blair | 427/252 |
| 4,439,267 | 0/0000 | Jackson | 156/614 |
| 4,509,997 | 4/1985 | Cockayne et al. | 148/175 |
| 4,524,090 | 6/1985 | Bottka et al. | 427/53.1 |

OTHER PUBLICATIONS

"The Growth of $Cd_xHg_{1-x}Te$ Using Organometallics", by J. B. Mullin et al., J. Vac. Science Technology, 21(1), May/Jun. 1982, pp. 178-181.

"Metal-organic Vapor Deposition of CdTe and HgCdTe Films", by W. E. Hoke et al., Journal of Applied Physics, vol. 54, No. 9 (Sep. 1983), pp. 5087-5089.

"High Quality $Hg_{1-x}Cd_xTe$ Epitaxial Layers By the Organometallic Process", by S. K. Ghandhi et al., Applied Physics Letter, vol. 44, No. 9 (Apr. 1984), pp. 779-781.

"Low Temperature CVD Growth of Epitaxial HgTe On CdTe", by T. F. Kuech, Solid-State Science and Technology, vol 128, No. 5 (May 1981), pp. 1142-1144.

"Growth by MOVPE and Characterisation of $Cd_xHg_{1-x}Te$", by S. J. C. Irvine et al., Journal of Crystal Growth (1981), pp. 107-115.

"Organometallic Growth of II-VI Compounds", by J. B. Mullin et al., Journal of Crystal Growth (1981), pp. 92-106.

"Low-Temperature Metalorganic Growth of CdTe and HgTe Films Using Ditertiarybutyltelluride", by W. E. Hoke et al., Appl. Phys. Lett., vol. 48, No. 24, 16 Jun. 1986.

"The Use of Metal-Organics In the Preparation of Semiconductor Materials", by H. M. Manasevit et al., Solild State Science (Apr. 1971), vol. 118, No. 4, pp. 644-647.

"Vapour Phase Epitaxy of $Cd_xHg_{1-x}Te$ Using Organo-mettalics", by J. B. Mullin et al., J. Phys. D:Applied Physics, 14 (1981), pp. L149-L151.

Robert Thornton Morrison et al., Organic Chemistry (Fourth Ed), Allyn and Bacon, Inc. (Dec. 18, 1986), pp. 109-110, 171-173, 398-400, 641-643.

Metalorganic Growth of CdTe and HgCdTe Epitaxial Films at a Reduced Substrate Temperature Using DIPT, W. E. Hoke & P. J. Lemonias.

Morrison and Boyd, Organic Chemistry (2nd Edition), pp. 118-129 & 390-395.

*Primary Examiner*—Janyce Bell
*Attorney, Agent, or Firm*—Denis G. Maloney; Richard M. Sharkansky

[57] ABSTRACT

A method for growing a Group II-VI epitaxial layer on a substrate is described. The method includes the steps of directing a plurality of vapor flows toward the substrate including a Group II metalorganic vapor, a Group VI organic vapor, with said Group VI organic having an organic group bonded to the Group VI element selected from the group consisting of a secondary alkyl, a tertiary alkyl, an allyl, a cycloallyl, and a benzyl, and a Group II elemental metal vapor. The directed flows of Group II metalorganic vapor, Group VI organic vapor and Group II metal vapor are chemically reacted to provide the epitaxial layer.

44 Claims, 3 Drawing Sheets

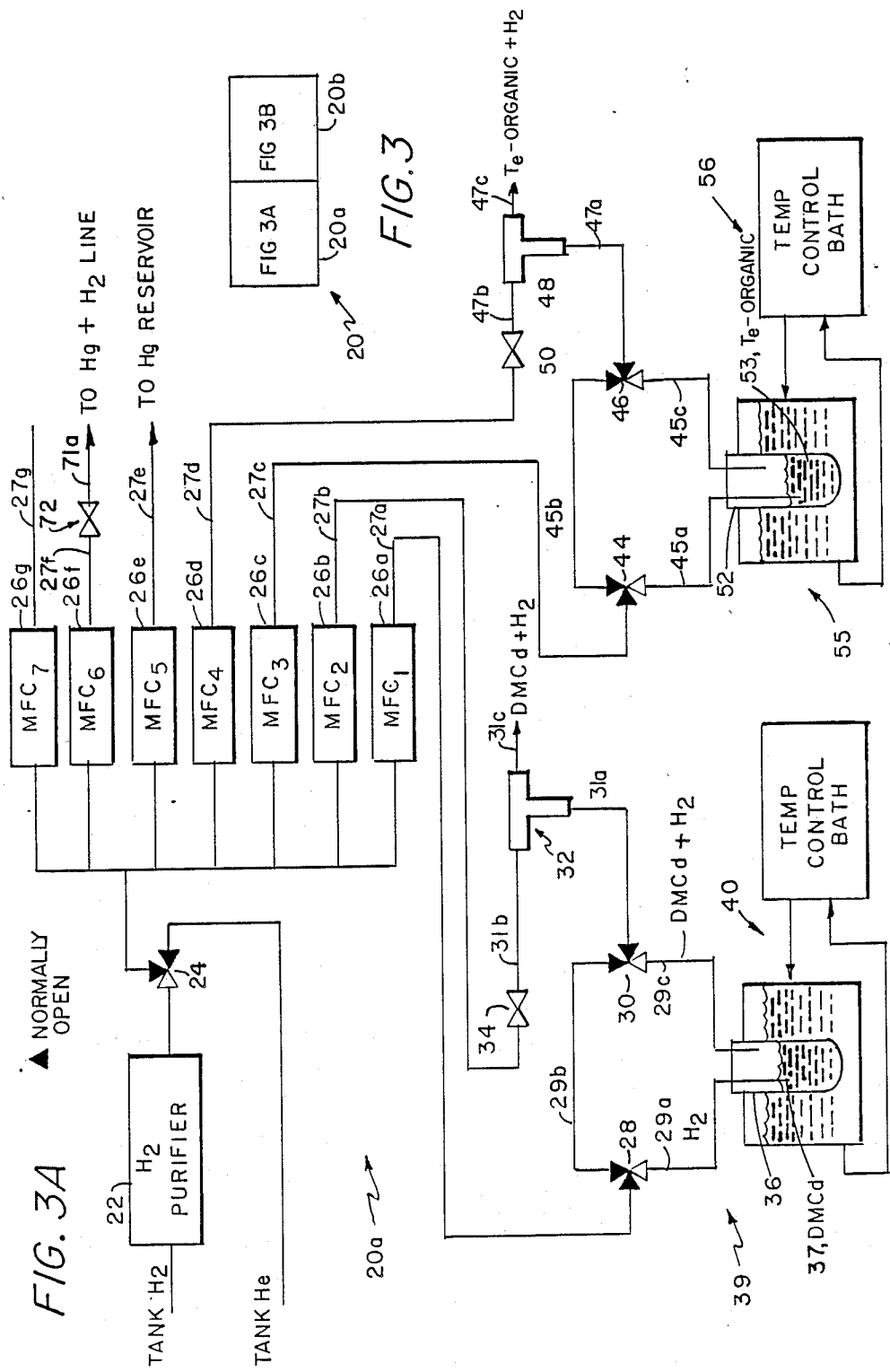

LOW TEMPERATURE METALORGANIC CHEMICAL VAPOR DEPOSTION GROWTH OF GROUP II-VI SEMICONDUCTOR MATERIALS

BACKGROUND OF THE INVENTION

This invention relates generally to epitaxial growth techniques, and more particularly, to growth of Group II-VI semiconductor crystalline materials.

As is known in the art, Group II-VI semiconductor epitaxial materials such as cadmium telluride and mercury cadmium telluride have important applications as photodetector elements for detection of electromagnetic energy in the spectral range from approximately 0.8 μm to 30 μm. By adjusting an alloy composition of Cd and Hg, photodetector elements comprised of mercury cadmium telluride may be fabricated to cover selected wavelength ranges within the 0.8 μm to 30 μm wavelength band. For short wavelength applications, i.e., those wavelengths close to 0.8 μm, cadmium telluride (CdTe) is generally used. For longer wavelengths greater than approximately 0.8 μm, mercury cadmium telluride ($Hg_{1-x}Cd_xTe$) is used where x is the alloy composition of cadmium to tellurium. By adjusting the alloy composition, an epitaxial material is provided which is responsive to selected portions of the entire spectral range of 0.8 μm to over 30 μm. That is, photodetector elements may be fabricated to be responsive to particular wavelength bands of infrared electromagnetic energy.

Several different techniques have been suggested for providing epitaxial layers of cadmium telluride and mercury cadmium telluride suitable for use in photodetector applications.

One method suggested to grow the epitaxial layers of HgCdTe and CdTe is metalorganic vapor phase epitaxy (MOVPE), also referred to as metalorganic chemical vapor deposition (MOCVD). The MOCVD technique involves directing vapors of primary alkyls of Group II and Group VI elements into a reactor vessel and chemically reacting the metalorganics to provide the epitaxial Group II-VI material. As described in an article entitled "The Growth of $Cd_xHg_{1-x}Te$ Using Organometallics" by J. B. Mullin et al, Journal of Vacuum Science Technology, Volume 21, No. 1, May-June 1982 [1], and as described in an article entitled "Vapor Phase Epitaxy of $Cd_xHg_{1-x}Te$ Using Organometallics" by J. B. Mullin et al, Journal of Applied Physics, Volume 14, 1981, pps. L149-151 [2], while heretofore epitaxial growth of mercury cadmium telluride epitaxial films has been demonstrated, as indicated in these articles, the quality of the epitaxial films grown is not suitable for use in the photodetector applications. Such materials are not suitable because they have relatively high carrier concentrations and the electron mobilities of the material are relatively low. These two properties are important in photoconductive detector elements, because such elements act as infrared sensitive resistors having a predetermined conductivity between a pair of contacts thereof, which changes in response to incident infrared energy. If the carrier concentration is too high, or the electron mobility is too low, carriers generated in response to the incident infrared radiation will recombine without the conductivity of the device changing between the terminals.

MOCVD growth of Group II-VI materials, for example, HgCdTe, includes the steps of directing primary alkyls of cadmium and tellurium, for example, dimethylcadmium, diethyltelluride, and a source of mercury into a reactor vessel where these materials react and form the HgCdTe. The Hg source is provided either by a metalorganic Hg compound such as dimethylmercury, diethylmercury or by elemental Hg. Elemental Hg is the preferred source since it is generally more pure than any of the metalorganic sources and is generally less expensive. Further, elemental Hg is less toxic than known metalorganic sources, since elemental mercury has a vapor partial pressure some $10^4$ times lower than the vapor pressure of known metalorganic Hg sources.

One problem encountered during growth of HgCdTe epitaxial layers is the relatively high growth temperatures required and relatively slow growth rates which heretofore have been achieved. In a third article entitled "The Growth by MOVPE And Characterization of $Cd_xHg_{1-x}Te$" by J. C. Irvine et al, Journal of Crystal Growth, Volume 55 (1981), pps. 107-115 [3], it was described that during growth of HgCdTe epitaxial layers, control of the Hg partial pressure over the growth region at an elevated temperature in the range of 400° to 500° is very difficult. Control of the equilibrium Hg partial pressure is very important because it is the concentration of Hg vacancies in the epitaxial layers which provide carriers and, hence, control the electrical properties of the material. It was further reported in reference [3] that the Hg partial pressure has to be at least two orders of magnitude greater than the Te partial pressure in order to allow the reaction producing the HgCdTe to efficiently proceed. At 400° C., the minimum Hg partial pressure for growth of HgCdTe is 0.01 atmospheres. Typically, this partial pressure of Hg is provided by heating the elemental liquid source of Hg and directing a carrier gas across the Hg to provide a Hg vapor stream.

One technique for providing Hg control is described in U.S. Pat. No. 4,568,379, filed Sept. 12, 1984, by William E. Hoke, Richard Traczewski and Peter J. Lemonias, and assigned to the same assignee as the present invention. There the Hg partial pressure, and hence the electrical properties of the HgCdTe epitaxial layers, were controlled by maintaining the temperature of the Hg in the incoming vapor stream through heating of the walls of the reactor to a temperature of at least 240° C. While such a technique allows for control of the Hg partial pressure over the growth region by preventing premature condensation of Hg from the vapor stream onto the reactor walls, it also has been observed that, at this temperature, pre-reaction of the reactants may occur. While it has not been determined whether pre-reaction has any effect on the quality of the epitaxial layers, it appears nevertheless that the pre-reaction reduces the concentration of the reactants in the vapor stream, thus further reducing the growth rate.

It was also described in reference [3] that the low temperature limit in HgCdTe growth by MOCVD is the relatively high stability or low cracking efficiency of the organic reactants dimethylcadmium (DMCd) and diethyltelluride (DETe) which provide the sources of Cd and Te. It was also found that DETe is the more stable compound of the two, and the yield of Te was very much dependent on the temperature of which the DETe would dissociate. At temperatures or about 400° C., the amount of Te which was freed from the DETe was relatively small. Accordingly, the growth rate of HgCdTe at 400° C. is very low.

Several additional problems have also been shown with MOCVD growth of HgCdTe. A high concentration of reactants is required to provide a suitable growth rate of HgCdTe. Since the cracking efficiency of the reactants is low, there is a large waste of reactants. However, the reactants, particularly metalorganic sources of Cd and Te, are very expensive.

Therefore, the large waste of reactants makes epitaxial growth of such layers relatively expensive. Furthermore, the waste products are highly toxic, and, therefore, the large volume of waste reactants produced by typical prior processes poses a significant problem for safe disposal of the toxic waste products.

Moreover, at growth temperatures of 400° C. there is significant interdiffusion and alloying of adjacent layers of different epitaxial materials. This problem complicates growth of well-defined heterostructures and abrupt electrical P-N junctions.

SUMMARY OF THE INVENTION

In accordance with the present invention, a Group II-VI crystal layer is provided over a crystalline substrate. A first flow comprising the Group II metal is directed toward the substrate. A second flow of an organic of the Group VI element is also directed toward the substrate. The Group VI organic includes an organic group having a relatively low activation energy compared to the activation energy of a tertiary alkyl of the Group VI element for formation of a free radical during disassociation of the radical from the Group VI element. The lower activation energy is due to delocalizing of the unpaired electron charge over the radical molecule. With this arrangement, such an organic group provides increased delocalizing of electron charge over the entire molecule compared to alkyls of the Group VI element, thus providing a Group VI organic compound having a lower activation energy or less stability and consequently a higher cracking efficiency at a particular temperature than known alkyls of the Group VI element. This lower stability will enhance cracking efficiency of the Group VI organic and will permit growth of Group VI epitaxial material to take place at lower growth temperatures and higher growth rates than prior techniques. With increased efficiency there is also a concomitant reduction in the volume of waste products produced during epitaxial growth of the Group VI material, and, furthermore, since the organics of the Group VI elements are relatively expensive, the reduction in waste of unreactive products and accompanying increase in growth rate efficiency will reduce the overall cost of growing epitaxial layers of Group II - VI materials.

In accordance with a still further aspect of the present invention, a Group II - VI crystal layer is grown over a substrate by directing a plurality of vapor flows toward the substrate. The vapor flows include a Group II metalorganic, a Group VI organic vapor comprising at least one organic group selected from the group consisting of an allyl group, a benzyl group and a cycloallyl group which is bonded to the Group VI element, and a Group II metal vapor. The source of Group II metal is heated to a temperature in the range of 100° C. to 250° C., preferably within the range of 150° C. to 180° C., while radiant energy is directed toward the reactor vessel to warm the walls of the reactor vessel between the Group II metal source and the substrate to a temperature within the range of 100° C. to 250° C., preferably within the range of 150° C. to 180° C. The zone over the substrate is heated to a temperature of at least 120° C., preferrable within the range of 120° C. to 400° C., more preferably in the range of 150° C. to 300° C., and most preferably in the range of 160° C. to 220° C. The directed flows of the Group II metalorganic vapor, Group VII organic vapor, and Group II metal vapor are then chemically reacted to form the Group II-VI layer. With this arrangement, by providing the Group VI element from a Group VI organic having an organic group selected from the group consisting of an allyl group, a benzyl group and a cycloallyl group delocalized free electron charge is distributed over the entire carbon chain.

In the case of the allyl radical the molecule can be represented in the equivalent structures as shown below:

$$CH_2=CH-CH_2 \bullet \longleftrightarrow \bullet CH_2-CH=CH_2$$

Hence, the unpaired electron is delocalized over the entire molecule to form a stabilizing partial double bond. The activation energy for the formation of a free radical from molecules having allyl or cycloallyl groups is lower than the activation energy for molecules having primary alkyls.

Similarly, with the benzyl group the delocalized electron charge over the entire carbon chain reduces the activation energy for the formation of the free radical from the parent hydrocarbon molecule having the benzyl group.

The benzyl radical may be represented in four equivalent structures as shown below:

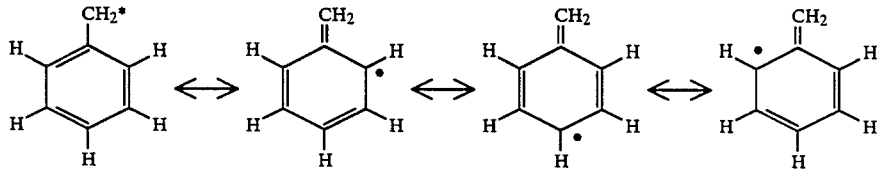

Thus another representation of the benzyl radical is:

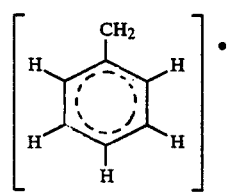

The double-bonding characteristics of the benzene ring permits delocalization of the unpaired electronic charge over the benzene ring. The third example of a group to provide a Group VI molecule having lower stability, i.e., lower activation energy, is the cycloallyl group. The molecule incorporating the cycloallyl group is destabilized by the presence of the allyl groups as well as the destabilization caused by ring strain.

The cycloallyl ring molecules have a general structure as set forth below:

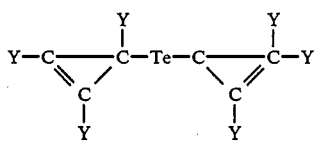

where Y may be hydrogen or any other organic group.

Accordingly, growth of epitaxial Group II - VI material can occur at lower growth temperatures than prior techniques. The lower growth temperatures tend to reduce interdiffusion between adjacent, different epitaxial layers, and, with reduced interdiffusion, sharper and more defined heterostructures and p-n junctions may be provided.

In accordance with an additional aspect of the present invention, the organic source of the Group VI element is selected from the group consisting of methylbenzyltelluride, dibenzyltelluride, di(2-propen-1-yl)telluride, methyl-(2-propen-1-yl)telluride, di(2-cyclopropen-1-yl)telluride, and methyl-(2-cyclopropen-1-yl)telluride. The metalorganic source for the Group II element is dimethylcadmium and the source for the Group II element is elemental mercury. For growth in a reactor having a diameter of 50 mm and having a total carrier flow of about 2.0 l/min, the following typical ranges of mole fractions of the reactants are believed appropriate. The dimethylcadmium will have a mole fraction generally of $5 \times 10^{-5}$ to $5 \times 10^{-4}$. The Group VI organic will have a mole fraction in the range of $5 \times 10^{-4}$ to $5 \times 10^{-3}$ and the mercury vapor will have a mole fraction generally the range of $1 \times 10^{-3}$ to $1 \times 10^{-2}$. The source of mercury is heated to a temperature in the range of 100° C. to 250° C. and the reaction zone between the metal source and substrate is heated to a temperature of 100° C. to 250° C. The flows of the selected Group VI organic, dimethylcadmium and mercury, are directed toward the substrate which is disposed in a region which is at a temperature of at least 120° C. The Group VI organic, dimethylcadmium, and mercury are reacted to provide an epitaxial HgCdTe layer. With this particular arrangement crystal layers of mercury cadmium telluride may be grown having relatively low carrier concentrations and relatively high electron mobilities. Since the temperature at which the growth takes place occurs at lower temperatures than in prior techniques, there is less interdiffusion between epitaxial layers of different materials. Accordingly, heterostructures such as alternating CdTe, HgTe and HgCdTe layers may be grown without significant interdiffusion or alloying. Further, when growing layers to provide PN junctions, there will be significantly less interdiffusion; hence, sharper more abrupt junctions will be provided. Further still, at the lower growth temperatures the equilibrium Hg partial pressure will be lower, and, hence, less Hg is required. Since the equilibrium Hg partial pressure is lower at lower growth temperatures, the Hg vacancy concentration (hence carrier concentration) is easier to control.

BRIEF DESCRIPTION OF THE DRAWINGS

The foregoing features of this invention, as well as the invention itself, may be more fully understood from the following detailed description of the drawings, in which:

FIG. 3 is a view showing the relationship between FIGS. 3A and 3B; and

FIGS. 3A, 3B are schematic diagrams of a growth apparatus for use in growing the epitaxial layer shown in FIG. 1.

DESCRIPTION OF THE PREFERRED EMBODIMENTS

Figure 1:
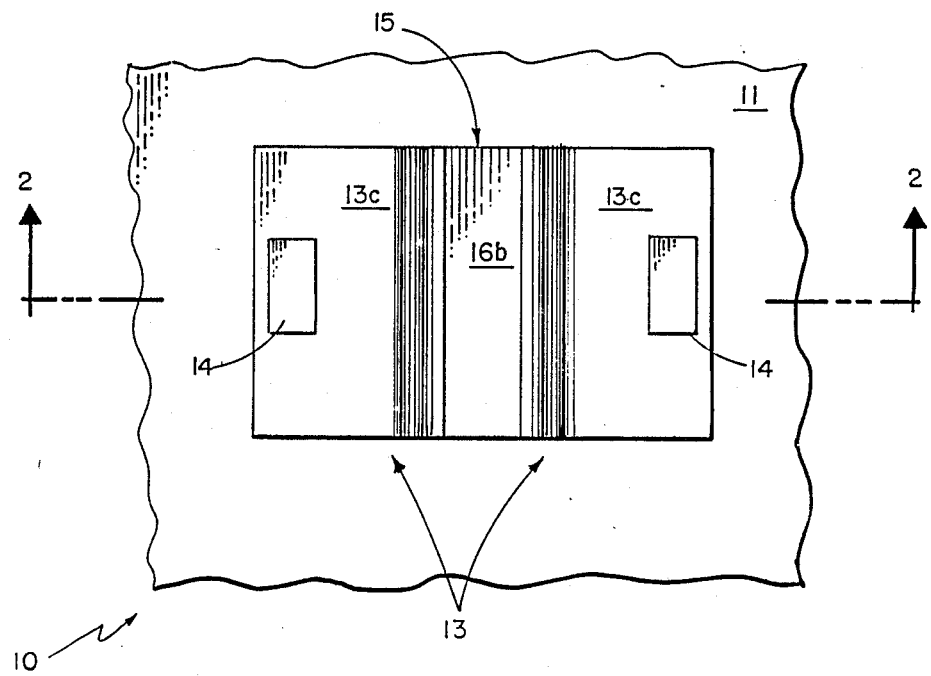
FIG. 1 is a plan view of a photodetector element, here a photoconductive element including crystal layers of Group II–VI semiconductor materials.
Figure 2:
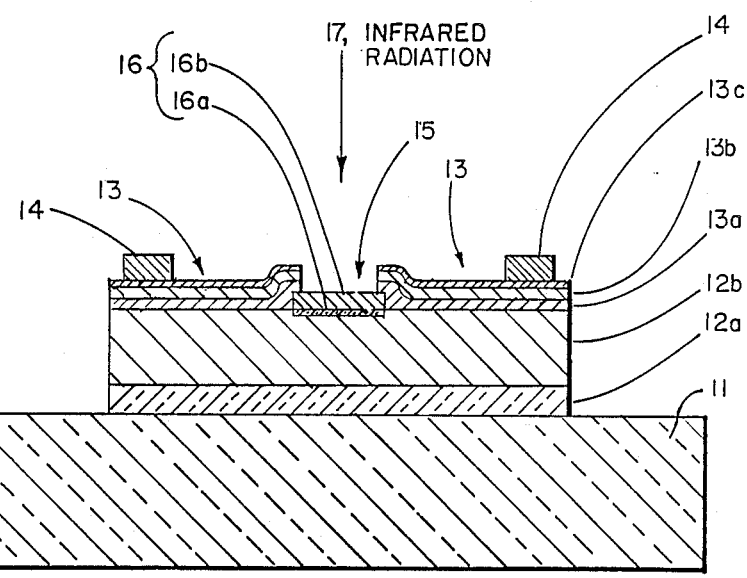
FIG. 2 is a cross-sectional view taken along line 2—2 of FIG. 1.

Referring now to FIGS. 1 and 2, a typical photoconductive element 10, suitable for use in a photoconductive array (not shown), is shown to include a substrate 11, here to cadmium telluride (CdTe), or gallium arsenide (GaAs), indium antimonide (InSb), other suitable Group II-VI or Group III-V substrate material or sapphire ($Al_2O_3$). Disposed on substrate 11 is a Group II-VI epitaxial buffer layer 12a, here of cadmium telluride (CdTe) and an epitaxial layer 12b of cadmium telluride (CdTe) or mercury cadmium telluride (HgCdTe) or other suitable Group II - Group VI material. Disposed on portions of the epitaxial layer 12b are a pair of electrical ohmic type contacts 13, each provided from a patterned composite layer comprising sequentially deposited layers 13a, 13b and 13c, respectively, of Indium (In), 10,000 Å thick, Chromium (Cr), 500 Å, and gold (Au), 5000 Å thick. Gold pads 14, each 1.5 μm thick, are disposed over the contacts 13 to provide a bonding point to external components.

Disposed in a channel region 15 between the ohmic contacts 13 is a passivation layer 16a, here of an in situ anodic oxide formed from a portion of HgCdTe layer 12b as is known, 800 Å thick, and an anti-reflection coating layer 16b. Layers 16a, 16b are used to protect the channel region 15 and to provide a composite layer window 16 which is transparent to electromagnetic energy generally in the wavelength range of approximately 0.8 μm to 30 μm.

Incident electromagnetic radiation 17 generally in the range of 0.8 μm to 30 μm is directed towards the window 16. In response to such incident radiation 17, the conductivity of the epitaxial layer 12b changes, thus permitting photoconductive element 10 to detect the presence of the incident electromagnetic radiation 17. Further, the ratio x of Cd to Te may be adjusted, as is shown, to selectively cover different ranges of wavelengths within the band of approximately 0.8 μm to 30 μm.

Figure 3B:
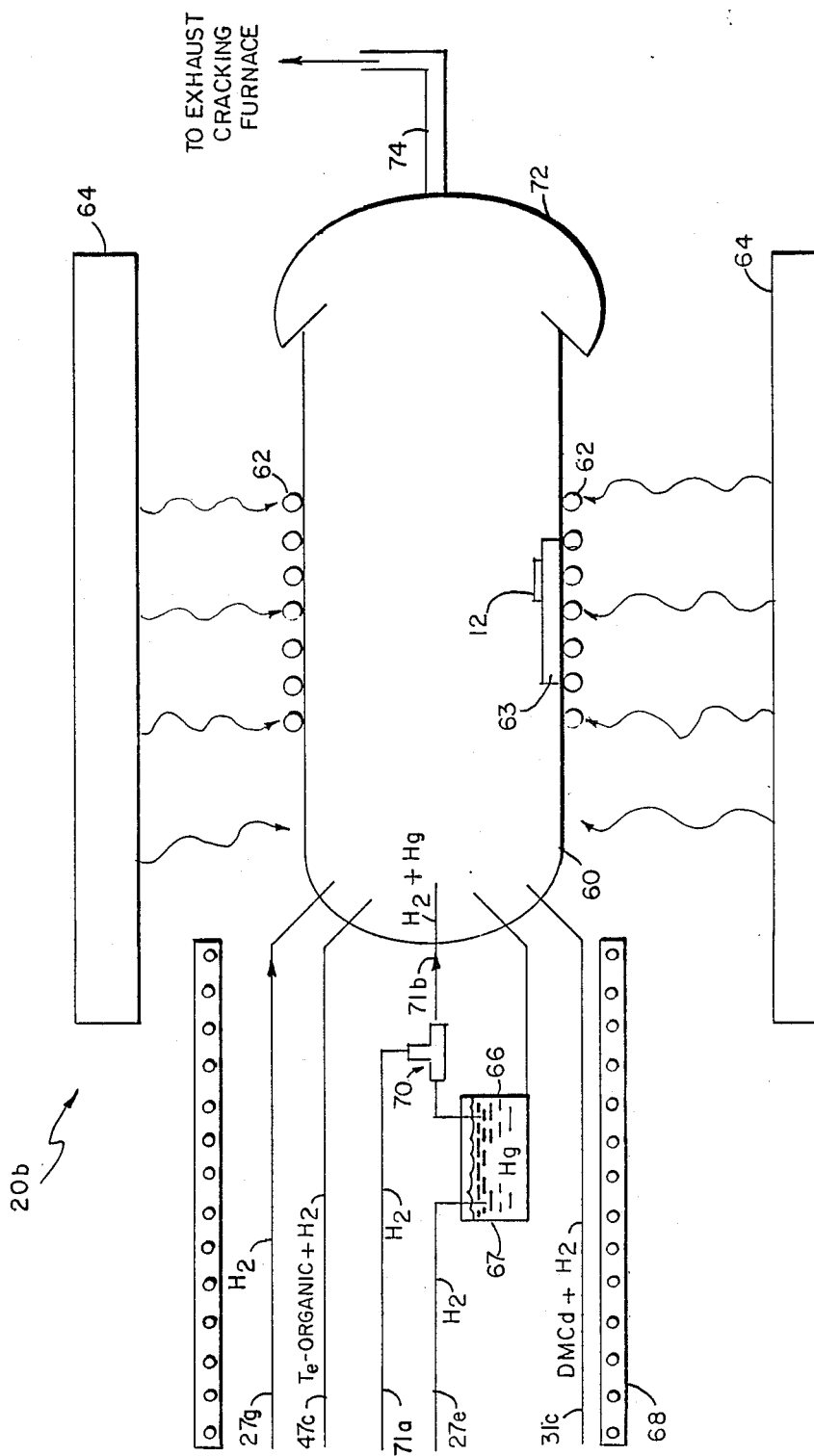

Referring now to FIGS. 3, 3A and 3B, a schematic representation of a vapor phase epitaxial apparatus 20 (FIG. 3) used for growing the epitaxial layers 12a, 12b of cadmium telluride or mercury cadmium telluride, as described in conjunction with FIGS. 1 and 2 above, includes a vapor apparatus 20a (FIG. 3A) having a manifold 26 with mass flow controllers 26a–226g, and bubbler apparatus 39 and 55, as shown. During operation, hydrogen is fed via $H_2$ purifier 22 and valve 24 to manifold 26, whereas, helium is fed through apparatus 20 when the apparatus 20 is inoperative and exposed to air. The vapor phase apparatus 20 also includes a vapor phase epitaxial reactor 20b (FIG. 3B), here including an open quartz reaction tube 60, as shown. Suffice it to say here that a graphite susceptor 63 is disposed in the quartz reaction tube 60 and the susceptor is inductively heated by an RF coil 62. RF coil 62 is disposed around the periphery of quartz reactor tube 60 and is activated to raise the temperature of the susceptor 63, a substrate 11 disposed on the susceptor 63, and the immediate region 61 around the substrate to a predetermined temperature. The temperature of the susceptor 63 is monitored via a thermocouple (not shown) embedded in the susceptor 63. Prior to the susceptor 63 and the substrate 11 being heated, however, the system is purged of atmospheric gases by introducing helium, then hydrogen into the interior of the furnace tube 60 and the vapor apparatus 20a. Then, vapors from lines 27e-27g, 31c and 47c are fed into the tube where they react to provide the epitaxial layers 12a, 12b. Quartz reaction tube 60 also includes a cap 72 at an opposite end from lines 27e-27g, 31c and 47c. Cap 72 is coupled to a quartz exhaust line 74 which is used to exhaust gases from tube 60 and deliver such gases to a cracking furnace (not shown).

Referring now particularly to FIG. 3A, the vapor apparatus 20a provides tubes 31c, 47c and 27e-27g which feed vapors to the quartz reaction tube 60 (FIG. 3B), as shown.

Tube 31c, the dimethylcadmium +H$_2$ (DMCd 30 H$_2$) tube is fed from a junction member 32. Junction member 32 is used to mix flows from two gas sources delivered to a pair of ports thereof, and direct said mixed gas flow to a third port thereof which is coupled to the quartz tube 31c. The first port of junction 32 is fed from the bubbler apparatus 39. Bubbler apparatus 39 includes a pair of solenoid control valves 28, 30. A first one of said solenoid control valves, here solenoid control valve 28, has a first port coupled to a first mass flow controller 26a, via tube 27a, and has a second port coupled to a bubbler 36, via tube 29a. Bubbler 36 here has disposed therein the dimethylcadmium (DMCd) 37. The bubbler 36 is provided in a recirculating temperature control bath 40 which provides a constant flow of a coolant liquid around the bubbler 36 to maintain the dimethylcadmium 37 contained in bubbler 36 at a predetermined temperature of here 18.5° C. A second tube 29c is disposed in bubbler 36, but above the surface of the dimethylcadmium liquid and is coupled to a port of solenoid control valve 30. A third tube 29b is coupled between remaining ports of solenoid control valves 28 and 30.

The normally deactivated state of solenoid control valves 28 and 30 enables hydrogen gas to pass from the hydrogen source, here the mass flow controller 26a via tube 27a to tube 29b, and on through tube 31c to purge the reactor vessel of atmosphere gases as described above. During epitaxial growth of cadmium telluride or mercury cadmium telluride over substrate 11, valves 28 and 30 are placed in their activated state enabling hydrogen gas to pass through tube 29a into bubbler 36 which contains the dimethylcadmium liquid 37. The hydrogen gas bubbles through the dimethylcadmium liquid 37 and picks up molecules of dimethylcadmium 37. Therefore, a mixture of dimethylcadmium and hydrogen (DMCd+H$_2$) emerges from bubbler 36 via line 29c and is routed by solenoid control valve 30 to line 31a. A second mass flow controller 26b is activated to provide a predetermined flow of carrier gas, here hydrogen, through a valve 34 and via line 31b to junction member 32. Therefore, emerging from line 31c is a diluted vapor flow of dimethylcadmium and the carrier gas, here hydrogen.

Tube 47c, the "Te-organic tube," is fed from a junction member 48. Junction member 48 is used to mix flows from two gas sources and deliver said mixed gas flow to a third port coupled to tube 47c. The first port of junction 48 is fed from the bubbler apparatus 55. Bubbler apparatus 55 includes a pair of solenoid control valves 44, 46. A first one of said solenoid control valves, here solenoid control valve 44, has a first port coupled to a third mass flow controller 26c, via tube 27c, and has a second port coupled to a bubbler 52 via tube 45a. Bubbler 52 here has disposed therein a Te-organic 53 as will be described hereinafter. Suffice it to say here that the Group VI organic, here a Te-organic, has an activation energy to form a radical during dissociation of the the Te-organic that is lower than the activation energy during disassociation of primary alkyls of tellurium. The bubbler 52 is provided in a recirculating temperature control bath 56 which provides a constant flow of a liquid around the bubbler 52 to maintain the tellurium organic 53 in bubbler 52 at a predetermined temperature sufficient to provide adequate vapor pressure. This range may extent but not necessarily be limited to the range of −20° C. to +100° C. A second tube 45c is disposed in bubbler 52, but above the surface of the tellurium organic, and is coupled to a port of solenoid control valve 46. A third tube 45b is coupled between remaining ports of solenoid control valves 44 and 46.

The normally deactivated state of solenoid control valves 44 and 46 enables hydrogen gas to pass from the hydrogen source, here the mass flow controller 26c via tube 27c to tube 45b, and on through tube 47c to purge the reactor vessel of atmospheric gases, as described above. During epitaxial growth of cadmium telluride or mercury cadmium telluride over substrate 11, valves 44 and 46 are placed in their activated state, enabling hydrogen gas to pass through tube 45a into bubbler 52 which contains the tellurium organic 53. The hydrogen gas bubbles through the tellurium organic 53 and picks up molecules of the tellurium organic 53. Therefore, a mixture of the tellurium organic and hydrogen (Te-organic+H$_2$) emerges from the tellurium organic 53, via line 45c, and is routed by solenoid control valve 46 to line 47a. A fourth mass flow controllers 26d is activated to provide a predetermined flow of carrier gas, here hydrogen, through a valve 50 and via line 47b to junction member 48. Therefore, emerging from line 47c is a diluted vapor flow of the tellurium organic with respect to the concentration of the carrier gas, here hydrogen.

Tube 27e is fed from a fifth mass flow controller 26e to a quartz reservoir 66 (FIG. 3B) containing liquid mercury. Hydrogen gas is directed over the surface of the liquid mercury, and vapor molecules of mercury over the liquid mercury surface are picked up by the hydrogen gas flow providing a vapor flow of mercury and hydrogen (Hg+H$_2$). The vapor flow is fed to a quartz junction element 70 (FIG. 3B). A second input port of quartz junction element 70 is fed via a quartz tube 71a which is coupled to a sixth mass flow controller 26f, via a valve 72 and tube 27f. Emerging from junction element 70 via tube 71b and into tube 60 is, therefore, a diluted flow of mercury vapor and hydrogen.

Referring particularly now to FIG. 3B, as previously mentioned, the susceptor 63 is heated by an r.f. coil disposed around the quartz reaction tube 60.

A quartz reservoir 66 containing the liquid elemental mercury and the region adjacent thereof is resistively heated by a resistance heat source 68, as shown, to a temperature of at least 100° C., but generally less than 250° C. preferrable within the range of 150° C. to 180°

C. The zone immediately after the reservoir 66 and past the substrate 11 is then heated by banks of infrared lamps 64 to a temperature in the range of 100° C. to 250° C. with 150° C. to 180° C. being the preferred temperature range. Heating of the walls prevents premature condensation of mercury from the vapor stream. Heating to the preferred temperature range, however, is below the temperature at which the DMCd, the tellurium organic and Hg react, thus limiting the loss in concentration of the reactants over the growth region. Also, high quality epitaxial films are provided since the diluted flows of the tellurium organic, DMCd, and Hg in the H₂ carrier gas further reduce premature reactions between mercury and the tellurium organic and the tellurium organic and dimethylcadmium.

The outwardly exposed surface of the substrate 11 is degreased and cleaned using appropriate solvents and then polished using an appropriate material which will etch the material of the substrate. For example, a bromine methanol solution is used to chemically polish CdTe or GaAs before growth of the various epitaxial layers. The substrate 11 is then placed on the susceptor 63 which is then disposed in the quartz reaction tube 60.

In operation, furnace tube 60 is purged of atmospheric gases by introduction of helium and then hydrogen gas as described above. The susceptor 63 is then inductively heated by the r.f. coil 62, the reservoir 66 by the resistive heating element 68, and reaction tube 60 by the infrared lamps 64. Each is then allowed to reach the growth temperatures. When the apparatus 20b has reached the growth temperatures, valves 28, 30, 34, 44, 46, 50 and 72 are activated enabling diluted mixtures of hydrogen gas+dimethylcadmium, hydrogen gas+the tellurium organic, and hydrogen gas+mercury to emerge from tube 31c and 47c and 71b, respectively, upstream from the substrate 11. The hydrogen and metalorganic vapors are at the desired operating temperature provided by the uniform heating of the substrate 11 and the region 61 around the substrate 11. The directed vapors will decompose into gaseous hydrocarbons, elemental cadmium and tellurium in accordance with the following chemical reactions:

$$(CH_3)_2Cd \longrightarrow (CH_3)_2Cd + Cd + \text{hydrocarbons}$$

$$\text{tellurium organic} \longrightarrow \text{tellurium organic} + Te + \text{hydrocarbons}$$

The elemental mercury, cadmium and tellurium will then react to form:

$$(1-x)Hg + (x)Cd + Te \rightarrow Hg_{1-x}Cd_xTe$$

The composition x is controlled by regulating the flow of H₂ into the Hg reservoir, the temperature of the Hg reservoir and the concentration of DMCd and the tellurium organic.

The mole fraction (i.e., concentration of DMCd, Te organic and Hg) is given by:

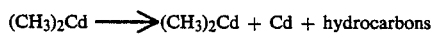

$$MF(DMCd) = \frac{H_2 \text{ through bubbler 36}}{\text{Total } H_2 \text{ Flow in Tube 60}} \times$$

$$\frac{DMCd \text{ Vapor Pressure (Torr)}}{760 \text{ (Torr)}}$$

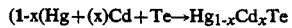

$$MF(\text{Te organic}) = \frac{H_2 \text{ through bubbler 52}}{\text{Total } H_2 \text{ Flow in Tube 60}} \times$$

$$\frac{\text{Te organic Vapor Pressure (Torr)}}{760 \text{ (Torr)}}$$

$$MF(Hg) = \frac{H_2 \text{ over reservoir 66}}{\text{Total } H_2 \text{ Flow in Tube 60}} \times$$

$$\frac{Hg \text{ Vapor Pressure (Torr)}}{760 \text{ (Torr)}}$$

Only a portion of the metalorganic vapors which are directed over the substrate 11 is actually reacted. However, due to the relatively high efficiency with which the Te organic is cracked compared to DETe, the amount of unreacted Cd, Te and Hg, as well as the metalorganic vapors of Cd and Te present in the vapor stream, is substantially less than that when DETe is used as the source of Te. Therefore, unreacted metalorganic vapors are exhausted from the reactor tube 60 via the exhaust line 74 and are directed towards an exhaust cracking furnace (not shown) which operates at a temperature in the range of 800° C. to 900° C. This furnace is used to crack the remaining metalorganic gases into the elements and provide a gas stream which comprises substantially hydrogen and various hydrocarbons.

As mentioned in copending application, Ser. No. 838,192 filed Mar. 7, 1986, now abandoned, which is a continuation of Ser. No. 749,851, filed June 28, 1985 by W. E. Hoke and P. L. Lemonias, now abandoned, and, as mentioned in copending application Ser. No. 844,489, filed Mar. 26, 1986 by W. E. Hoke and P. L. Lemonias, now abandoned, both of which are assigned to the assignee of the present invention, high growth rates of HgCdTe or other Group II-VI materials are obtained using diisopropyltelluride or ditertiarybutyltelluride in the MOCVD technique. The general chemical formula of diisopropyltelluride is given below:

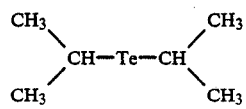

Thus, diisopropyltelluride has a structure of the general formula R₂ - X - R₂ where the two R₂ alkyl groups may or may not be the same, and where at least one of the R₂ groups is a secondary alkyl group having the general formula (r₂ CH—) where r₂ includes two carbon atoms bonded to the carbon atom of the CH-group. Diisopropyltelluride has a lower stability and, hence, enhanced cracking efficiency when compared to the cracking efficiency of DETe. DIPTe is a preferred example of a secondary alkyl of the Group VI element tellurium. This is because the carbon in each CH-group which is bonded to the Te atom is in turn bonded to two other carbon atoms. Less energy is required to break the bond between such a carbon atom and the tellurium atom, and therefore, the DIPTe is more efficiency cracked than the prior known DETe.

The general chemical formula for diethyltelluride (DETe) is:

$$CH_3-CH_2-TE-CH_2-CH_3$$

The carbon atom of each CH₂ group which is bonded to the tellurium atom is in turn bonded to only one other carbon atom. Hence, this compound has a high stability and will crack at a specified temperature at a less efficient rate than DIPTe.

Higher growth rates of mercury cadmium telluride or other Group II-VI materials were obtained by using ditertiarybutyltelluride in the MOCBD technique. The general chemical formula of ditertiarybutyltelluride is given below:

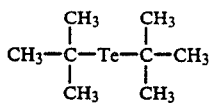

Thus, ditertiarybutyltelluride has a structure of the general formula $R_3-X-R_3$ where the two $R_3$ alkyl groups may or may not be the same, and where at least one of the $R_3$ groups is a tertiary alkyl group having the general formula $(r_3 C-)$ where $r_3$ includes three carbon atoms bonded to the C- carbon atom. Ditertiarybutyltelluride has a lower stability and hence enhanced cracking efficiency when compared to the cracking efficiency of diethyltelluride or diisopropyltelluride. This is because the C- carbon atom which is bonded to the Te atom is in turn bonded to three other carbon atoms. Less energy is required, therefore, to break the bond between this carbon atom and the tellurium atom and therefore the DTBTe is more efficiently cracked at a specified temperature than prior known DETe or the above described DIPTe. Ditertiarybutyltelluride is a preferred example of a tertiary alkyl of the Group VI element tellurium.

The mechanical responsible for reducing the activation energy for formation of free radicals is the delocalization of the unpaired electron charge. Organic groups which increase the delocatization of this charge over the free radical molecule decrease the energy of the free radical, and consequently reduce the activation energy. For alkyl tellurides as the ones mentioned above, the delocatization of the unpaired charge results from the overlap of the p orbital of the unpaired electron with the sigma orbitals of the alkyl groups bonded to the carbon tellurium-bonded atoms. Therefore, by attaching alkyl groups to the carbon tellurium-bonded atoms the delocatization is increased and consequently the activation energy for the formation of the free radical is reduced.

The carbon tellurium atoms are classified by the number of alkyl groups bonded to it. Therefore, the delocatization mechanism explains the stability order of DMTe 0°, greater than DETe 11°, greater than DIPTe 2°, greater than DTBTe 3°.

In accordance with a further aspect of the present invention, greater delocatization and consequently lower activation energies are provided using overlap of the p orbital of the unpaired electron with, double bonds instead of single bonds. The allyl radical ($CH_2=CH=CH_2°$) and the benzyl-radical ($C_6H_5-CH_2°$) delocalize the free electron over the entire carbon chain. In the case of the allyl radical, the radical can be represented in equivalent structures as shown below:

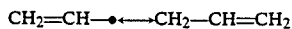

Consequently, another representation of the allyl radical is as follows:

The dashed lines in the above representation indicate that the unpaired electron is delocalized over the radical to form partial double bonds.

The Group VI (Te)allyl organic has a general structure as below:

$$X-Te-Y$$

where X is an allyl group as above and Y is hydrogen or an organic group which may or may not be an allyl group.

The situation with the benzyl-radical is similar to the allyl radical in that the double bonding characteristics of the benzene ring permit delocalization of the unpaired electron over the entire benzene ring.

The benzyl radical may be represented in equivalent structures as shown below:

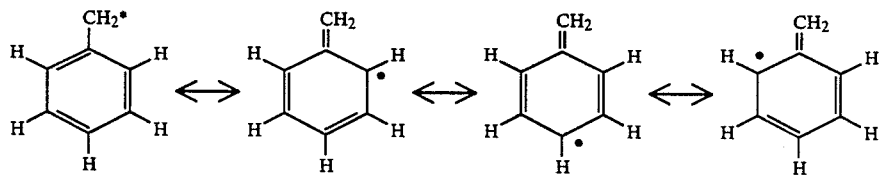

Consequently another representation of the benzyl radical is:

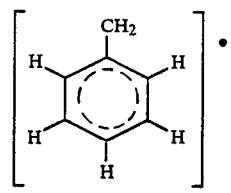

The Group VI (Te) benzyl has a general structure as below:

$$X-Te-Y$$

where X is a benzyl group and Y is hydrogen or an organic group which may or may not be a benzyl group.

The third example of a group to provide a Group VI molecule having lower stability, i.e., lower activation energy, is the cycloallyl group. The molecule incorporating the cycloallyl group is destablized by the presence of the allyl groups as well as the destablization caused by ring strain.

The cycloallyl ring molecules have a general structure as set forth below.

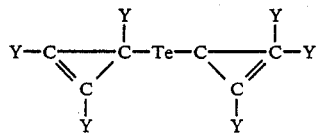

where Y may be hydrogen or any other organic group.

Examples of organotellurium compounds having low activation energies are set forth in the Table. As mentioned above in the generalized formula discussion it is only necessary to have a single destablizing free radical group in the organotellurium compound. Therefore, the organotellurium compound methyl-benzyltelluride $(CH_3)Te(CH_2)C_6H_5$ has almost the same stability, and hence similar activation energy as dibenzyltelluride. Other considerations may guide the use of certain of these materials. For example, methyl-benzyltelluride will have a higher vapor pressure than dibenzyltelluride.

Accordingly, by selecting the source of the Group VI material to be an organic compound having at least one organic group selected from the group consisting of the secondary and tertiary alkyls, an allyl radical, a cycloallyl radical and a benzyl radical, increased cracking efficiency of the Group VI organic at lower reaction temperatures is provided. Moreover, because of the increased cracking efficiency of the Group VI organic, high growth rates of Group II-VI materials can be provided at lower cost due to more efficient use of the reactants. Further, since growth can take place at lower growth temperatures, the amount of Hg used during growth of HgTe or HgCdTe, for example, is reduced. This allows for control and reduction of the Hg vacancy concentration and hence hole concentration. This also reduces the amount of Hg toxic waste generated during growth.

directing a flow comprising a least one Group II vapor species towards the substrate;

directing a flow of a Group VI organic vapor towards the substrate, said organic having at least one organic group having an activation energy for formation of a free radical during decomposition of the organic group from the Group VI element which is lower than the activation energy of tertiary alkyls of the group VI element and thermally decomposing.

2. The method as recited in claim 1 wherein the selected organic group has a double bonding characteristic and the lower activation energy for formation of a free radical is provided from delocalization of unpaired electron charge over the selected organic group having the double bonding characteristic.

3. The method as recited in claim 2 wherein the organic group is selected from the group consisting of an allyl group, a benzyl group and a cycloallyl group bonded to the Group VI element.

4. The method as recited in claim 3 wherein the Group VI element is tellurium.

5. A method for providing a layer comprising the step of:

decomposing a flow of a Group VI organic vapor directed towards a substrate comprised of a material selected from the group consisting of a Group II-VI material, a Group III-V material, and $Al_2O_3$, said organic having at least one group bonded to the Group VI element selected from the group consisting of an allyl group, a benzyl group and a cycloallyl group.

6. A method for providing a layer comprising Group II-VI material over a substrate comprising the steps of:
directing a flow comprising at least one Group II species towards the substrate;
directing a flow of a Group VI organic toward the substrate, said organic having at least one organic group selected from the group consisting of an allyl group, a benzyl group and a cycloallyl group bonded to the Group VI element; and
chemically reacting and thermally decomposing the directed flows to form the layer.

7. A method for providing a layer comprising Group II - VI material over a substrate comprising the steps of:
directing a flow of a Group II metalorganic vapor toward the substrate;

TABLE

| Formula | Representation | Name |
| --- | --- | --- |
| $(C_6H_5CH_2)_2Te$ | $C_6H_5-CH_2-Te-CH_2-C_6H_5$ | dibenzyltelluride |
| $CH_3(C_6H_5CH_2)Te$ | $CH_3-Te-CH_2-C_6H_5$ | methyl-benzyltelluride |
| $(CH_2CHCH_2)_2Te$ | $CH_2=CH-CH_2-Te-CH_2-CH=CH_2$ | di(2-propen-1-yl)telluride |
| $CH_3(CH_2CHCH_2)Te$ | $CH_3-Te-CH_2-CH=CH_2$ | methyl-(2-propen-1-yl)telluride |
| $(C_3H_3)_2Te$ | (cyclopropenyl structure with H substituents) | di(2-cyclopropen-1-yl)telluride |
| $CH_3(C_3H_3)Te$ | (methyl-cyclopropenyl-Te structure with H substituents) | methyl-(2-cyclopropen-1-yl)telluride |

Having described preferred embodiments of the invention, it will now be apparent to one of skill in the art that other embodiments incorporating their concepts may be used. It is felt, therefore, that these embodiments should not be limited to the disclosed embodiments, but rather should be limited only by the spirit and scope of the appended claims.

What is claimed is:

1. A method for providing a layer comprising a group II-VI material over a substrate comprising the steps of:

directing a flow of a Group VI organic vapor toward the substrate, said Group VI organic having at least one organic group selected from the group consisting of an allyl group, a benzyl group and a cycloallyl group bonded to the Group VI element; and chemically reacting and thermally decomposing the directed flows of Group II metalorganic vapor and Group VI organic vapor to form the layer.

8. The method as recited in claim 7 wherein the Group VI organic is selected from the group consisting of X-benzyltelluride, X-(2-propen-1-yl)telluride, X-(2-cyclopropen-1-yl)telluride, and where X is hydrogen or an organic group which may or may not be the same as the selected organic group bonded to the Te atom.

9. The method as recited in claim 7 further comprising the step of:
directing a flow of a Group II metal toward the substrate and wherein the reacting step includes reaction of the Group II metal with the Group II metalorganic and Group VI organic.

10. The method as recited in claim 9 wherein the Group II metalorganic vapor comprises dimethylcadmium, the Group VI organic comprises X-benzyltelluride, X-(2-propen-1-yl)telluride, X-(2-cyclopropen-1-yl)telluride, where X is hydrogen or an organic group which may or may not be the same as the selected organic group bonded to the Te atom and the Group II metal vapor comprises mercury.

11. The method as recited in claim 8 wherein the vapors are reacted at a temperature in the range of 120° C. to 400° C.

12. The method as recited in claim 8 wherein the vapors are reacted at a temperature in the range of 150° C. to 300° C.

13. The method as recited in claim 8 wherein the vapors are reacted at a temperature in the range of 160° C. to 220° C.

14. A method for providing a Group II-VI layer over a substrate comprising the steps of:
directing a flow of a Group II metalorganic toward the substrate;
directing a flow of a Group VI organic toward the substrate, said Group VI organic vapor having the general formula $R_1$-X-$R_2$, where $R_1$ and $R_2$ may or may not be the same and where at least one of groups $R_1$ and $R_2$ is a group selected from the group consisting of an allyl, a benzyl and a cycloallyl, and where X is a Group VI element; and
reacting and thermally decomposing said flows to provide the Group II-VI layer.

15. The method as recited in claim 14 wherein the Group II metalorganic vapor comprises dimethylcadmium and the Group VI organic is selected from the group consisting of X-benzyltelluride, X-(2-propen-1-yl) telluride, X-(2-cyclopropen-1-yl) telluride, and where X is hydrogen or an organic group bonded to the Te atom which may or may not be the same as the selected organic group bonded to the Group VI element.

16. The method as recited in claim 15 further comprising the step of:
directing a flow of a Group II metal toward the substrate and wherein the reacting step includes reaction of the Group II metal, with the Group II metalorganic and the Group VI organic.

17. The method as recited in claim 16 wherein the Group II metalorganic vapor comprises dimethylcadmium, the Group II metal is mercury and the Group VI organic vapor comprises an organic selected from the group consisting of X-benzyltelluride, X-(2-propen-1-yl) telluride, X-(2-cyclopropen-1-yl) telluride, where X is hydrogen or an organic group bonded to the Te atom.

18. The method as recited in claim 15 wherein the vapors are reacted at a temperature in the range of 120° C. to 400° C.

19. The method as recited in claim 15 wherein the vapors are reacted at a temperature in the range of 150° C. to 300° C.

20. The method as recited in claim 15 wherein the vapors are reacted at a temperature in the range of 160° C. to 220° C.

21. The method as recited in claim 17 wherein the vapors are reacted at a temperature in the range of 120° C. to 400° C.

22. The method as recited in claim 17 wherein the vapors are reacted at a temperature in the range of 150° C. to 300° C.

23. The method as recited in claim 17 wherein the vapors are reacted at a temperature in the range of 160° C. to 220° C.

24. The method as recited in claim 6 wherein the Group VI organic is dibenzyltelluride.

25. The method as recited in claim 6 wherein the Group VI organic is di(2-propen-1-yl)telluride.

26. The method as recited in claim 6 wherein the Group VI organic is di(2-cyclopropen-1-yl)telluride.

27. A method of forming a Group II-VI crystalline material, comprises the steps of:
providing a substrate comprised of a material selected from the group consisting of a Group II-VI material, a Group III-V, or $Al_2O_3$;
directing a flow of a Group II metalorganic vapor towards the substrate;
directing a flow of a Group VI organic vapor towards the substrate, said Group VI organic having at least one organic group selected from the group consisting of an allyl group, a benzyl group, and a cycloallyl group bonded directly to the Group VI element; and
depositing the Group II-VI material epitaxially over the substrate by pyrolytically chemically reacting the first and second vapor flows to form the Group II-VI material.

28. The method as recited in claim 27 wherein the Group VI organic is selected from the group consisting of X-benzyltelluride, X-(2-propen-1-yl)telluride, X-(2-cyclopropen-1-yl)telluride, and where X is hydrogen or an organic group which may or may not be the same as the selected organic group bonded to the Te atom.

29. The method as recited in claim 28 wherein the Group VI organic is selected from the group consisting of dibenzyltelluride, di(2-propen-1-yl)telluride, di(2-cyclopropen-1-yl)telluride.

30. The method as recited in claim 29 wherein the Group VI organic is dibenzyltelluride.

31. The method as recited in claim 29 wherein the Group VI organic is di(2-propen-1-yl)telluride.

32. The method as recited in claim 29 wherein the Group VI organic is di(2-cyclopropen-1-yl).

33. The method as recited in claim 27 further comprising the step of:
directing a flow of a Group II metal toward the substrate and wherein the depositing step includes depositing the Group II-VI material including the directed Group II metal over the substrate.

34. The method as recited in claim 33 wherein the Group II metalorganic vapor comprises dimethylcadmium, the Group II metal comprises an elemental source of mercury, the Group VI organic comprises an organic vapor selected from the group consisting of X-benzyltelluride, X-(2-propen-1-yl] telluride) X-(2-cyclopropen-1-yl)telluride, and where X is hydrogen or an organic group which may or may not be the same as the selected organic group bonded to the Te atom.

35. The method as recited in claim 34 wherein the Group VI is selected from the group consisting of dibenzyltelluride, di(2-propen-1-yl)telluride, di(2-cyclopropen-1-yl)telluride.

36. The method as recited in claim 35 wherein the Group VI organic is dibenzyltelluride.

37. The method as recited in claim 35 wherein the Group VI organic is di(2-propen-1-yl)telluride.

38. The method as recited in claim 35 wherein the Group VI organic is di(2-cyclopropen-1-yl).

39. The method as recited in claim 14 wherein at least one of $R_1$ and $R_2$ which may or may not be the same is a benzyl.

40. The method as recited in claim 39 wherein the Group VI organic is X-benzyltelluride, where X is hydrogen or an organic group bonded to the Te atom, which may or may not be the same as the benzyl group bonded to the Group VI element.

41. The method as recited in claim 14 wherein at least one of $R_1$ and $R_2$ which may or may not be the same is an allyl.

42. The method as recited in claim 41 wherein the Group VI organic is X-(2-propen-1-yl)telluride wherein hydrogen or an organic group bonded to the Te atom, which may or may not be the same as the alkyl group bonded to the Group VI element.

43. The method as recited in claim 14 wherein at least one of $R_1$ and $R_2$ which may or may not be the same is a cycloallyl.

44. The method as recited in claim 43 wherein the Group VI organic is X-(2-cyclopropen-1-yl)telluride, where X is hydrogen or an organic group bonded to the Te atom, which may or may not be the same as the cycloallyl group bonded to the Group VI element.

* * * * *